United States Patent

Hirata

[19]

[11] Patent Number: 5,862,516
[45] Date of Patent: *Jan. 19, 1999

[54] METHOD OF NON-HARMONIC ANALYSIS AND SYNTHESIS OF WAVE DATA

[76] Inventor: Yoshimutsu Hirata, 2568-9 Ishikawa-cho, Hachioji-shi, Tokyo 192, Japan

[*] Notice: This patent issued on a continued prosecution application filed under 37 CFR 1.53(d), and is subject to the twenty year patent term provisions of 35 U.S.C. 154(a)(2).

[21] Appl. No.: 495,675
[22] PCT Filed: Feb. 2, 1994
[86] PCT No.: PCT/JP94/00146
  § 371 Date: Oct. 4, 1995
  § 102(e) Date: Oct. 4, 1995
[87] PCT Pub. No.: WO94/18573
  PCT Pub. Date: Aug. 18, 1993

[30] Foreign Application Priority Data

Feb. 2, 1993 [JP] Japan .................................. 5-051209
Feb. 16, 1993 [JP] Japan .................................. 5-065865

[51] Int. Cl.$^6$ ........................................................ G06F 17/14
[52] U.S. Cl. ............................. 702/77; 702/66; 702/195; 364/724.19
[58] Field of Search ...................................... 364/484, 485, 364/487, 724.01, 724.19, 574, 572; 333/106; 702/66, 75, 76, 77, 191, 193, 194, 195

[56] References Cited

U.S. PATENT DOCUMENTS

| | | | |
|---|---|---|---|
| 3,691,486 | 9/1972 | Borsuk et al. | 333/166 |
| 3,979,701 | 9/1976 | Tomozawa | 333/166 |
| 3,991,277 | 11/1976 | Hirata | 333/166 |
| 4,204,174 | 5/1980 | King | 333/10 |
| 4,330,689 | 5/1982 | Kang et al. | 395/2.28 |
| 4,524,424 | 6/1985 | White | 364/724.19 |
| 4,561,102 | 12/1985 | Prezas | 381/49 |
| 4,589,083 | 5/1986 | Le Dinh et al. | 364/724.19 |
| 4,723,294 | 2/1988 | Taguchi | 381/94 |
| 4,769,847 | 9/1988 | Taguchi | 381/94 |
| 4,850,022 | 7/1989 | Honda et al. | 395/2.16 |
| 4,852,034 | 7/1989 | Takayama | 364/724.01 |
| 4,908,787 | 3/1990 | Dyer | 364/724.01 |
| 4,937,868 | 6/1990 | Taguchi | 381/38 |
| 5,091,944 | 2/1992 | Takahashi | 381/36 |
| 5,323,391 | 6/1994 | Harrison | 364/724.01 |

*Primary Examiner*—Eric W. Stamber
*Attorney, Agent, or Firm*—Jones, Tullar & Cooper, P.C.

[57] ABSTRACT

A novel method of non-harmonic analysis of a physical waveform is disclosed. A digitized wave data is multiplied by a first sine and a first cosine function having a first predetermined period, respectively, and the resulting products are respectively summed over a predetermined interval equal to an integer multiple of the first predetermined period. The resulting summation values are used to determine the amplitudes of the first sine and first cosine functions. A sine and a cosine waveform having the thus determined amplitudes and the first predetermined period are subtracted from the wave data to derive a residual wave data. The above steps are performed on the wave data successively using a second to n-th sine and cosine functions having a second to n-th predetermined periods to derive (n–1) residual wave data. The power of each residual wave data is checked to determine as a first non-harmonic frequency component the sine and cosine waveforms providing a minimum power. The sine and cosine waveforms are subtracted from the digitized wave data to derive a first residual waveform and the above steps are performed on the first to n-th residual waveforms successively to determine a second to n-th non-harmonic frequency components.

3 Claims, 6 Drawing Sheets

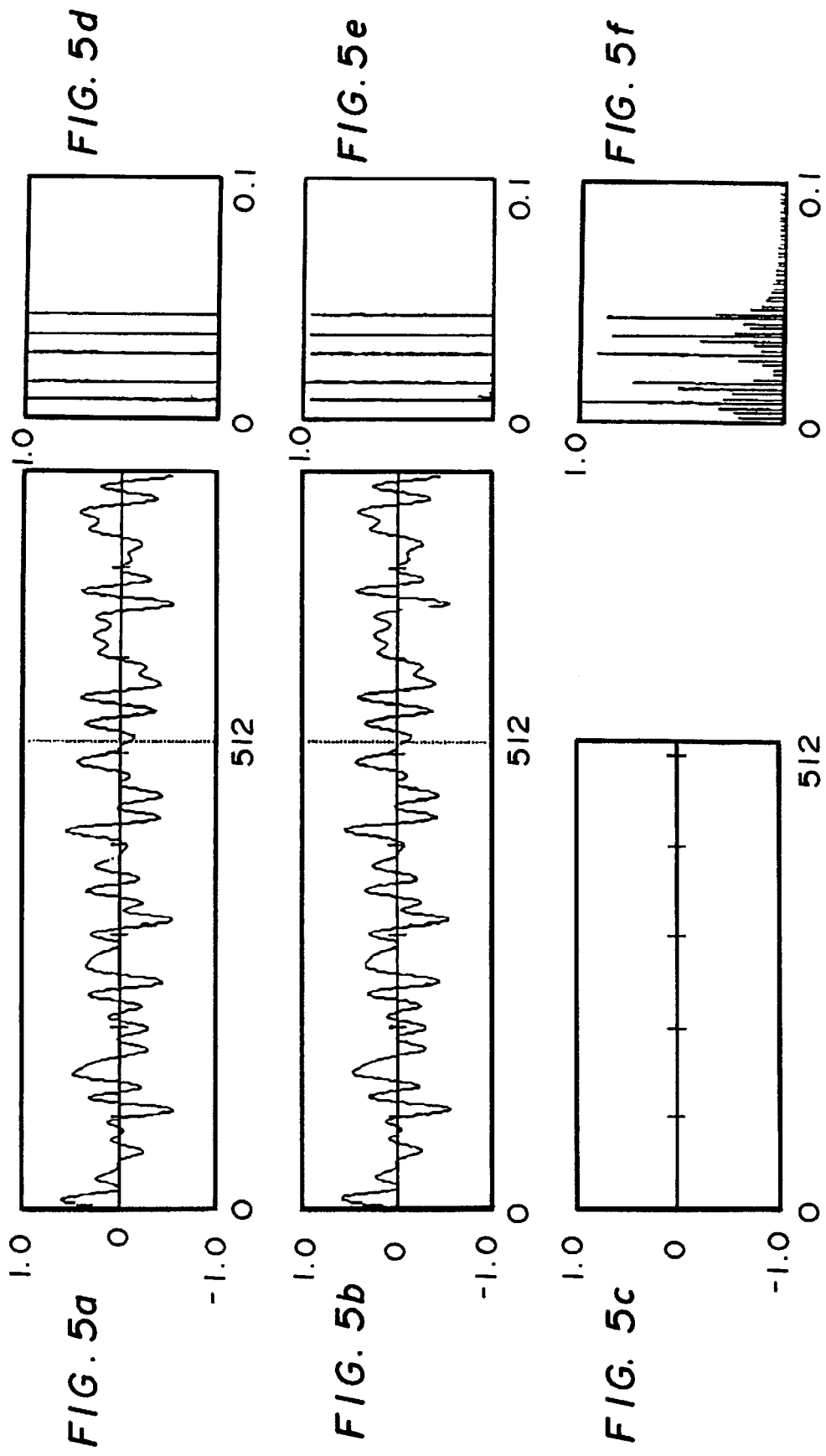

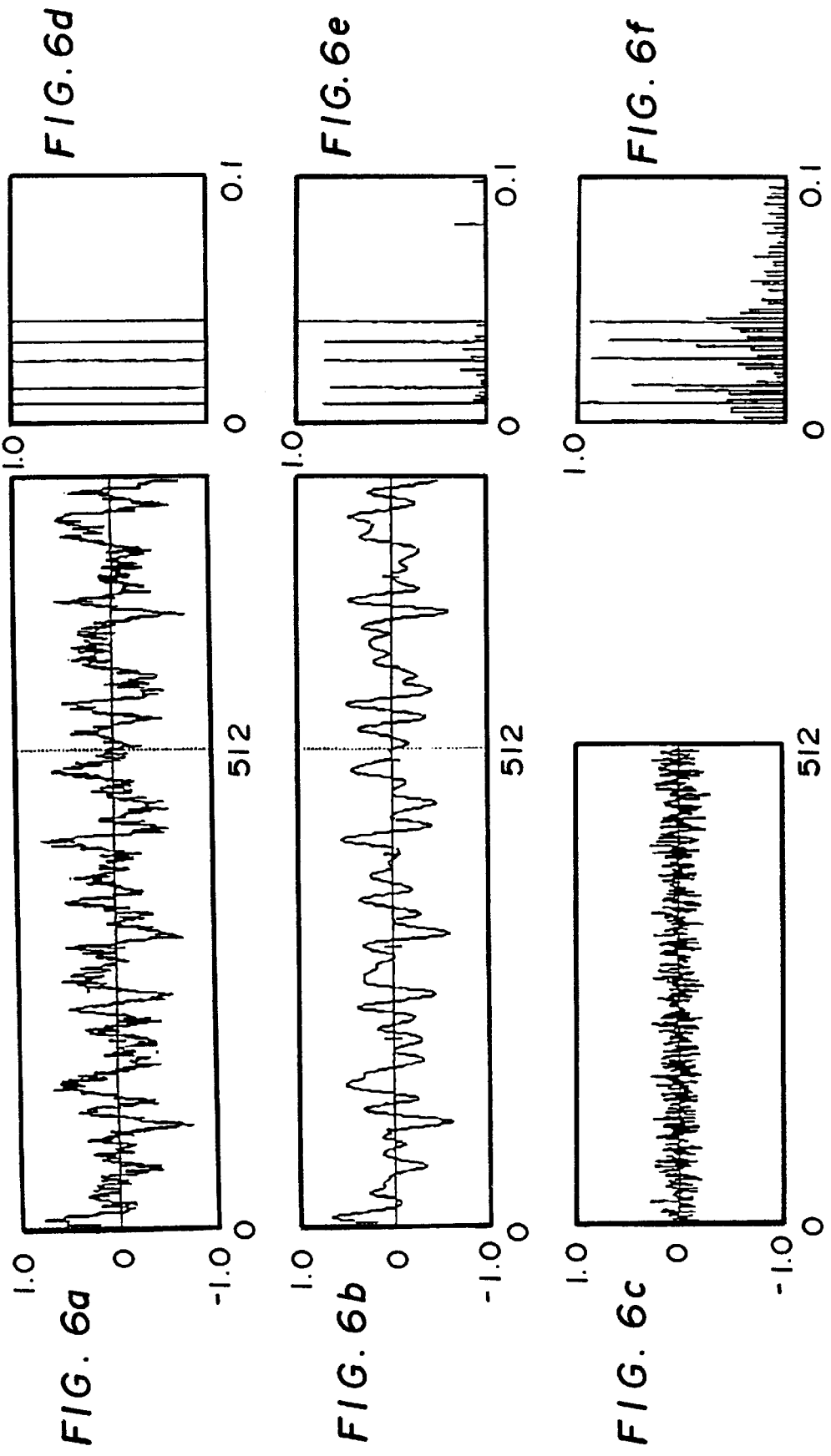

METHOD OF NON-HARMONIC ANALYSIS AND SYNTHESIS OF WAVE DATA

TECHNICAL FIELD

The present invention relates to the fields of waveform analysis, waveform synthesis, noise suppression, signal detection and transmission bandwidth compression using computers.

BACKGROUND ART

The Fourier analysis which is well known as FFT (fast Fourier Transformation) is one form of harmonic analysis in which frequencies to be analyzed have a harmonic relationship represented by n/T (n=1, 2, ... ) where T is the interval of a waveform. Periodgram is a known method for period analysis, however, this requires a waveform of sufficiently longer interval than the period for analysis and cannot attain accuracy unless the periodicity of the waveform is relatively prominent. This is also true of the correlation method. The auto regression model or auto regression moving average (ARMA) model that is used for time series analysis corresponds to a digital lowpass or bandpass filter and requires a waveform of sufficient interval as in the above approaches. Prony's method, which is a form of non-harmonic analysis, cannot make an accurate analysis when noise is present.

SUMMARY OF THE INVENTION

It is an object of the present invention to provide a method of detecting the period and amplitude of sinusoids which are not necessarily harmonic with one period from a waveform of relatively short interval with high accuracy, and a method of synthesizing such waveform.

To solve the above-stated problems, the present invention provides a method for analyzing a physical waveform into non-harmonic frequency components, comprising: (a) converting a given interval of a physical waveform into a corresponding digitized wave data; (b) multiplying said digitized wave data by a first sine and a first cosine function having a first predetermined period, respectively, to provide a first and a second product value; (c) summing said first and second product values over a first predetermined interval, respectively, to provide a first and a second summation value, said first predetermined interval being an integer multiple of said first predetermined period and being equal to or smaller than said given interval; (d) determining the amplitudes of said first sine and first cosine functions based on said first and second summation values, respectively; (e) subtracting from said digitized wave data a sine and a cosine waveform having the thus determined respective amplitudes and said first predetermined period to provide a residual wave data; (f) successively performing the steps (b) to (e) on said digitized wave data using a second to n-th sine and cosine functions having a second to n-th predetermined periods to provide their respective (n-1) residual wave data; (g) checking the power of said n residual wave data to determine as a first non-harmonic frequency component said sine and cosine waveforms providing a minimum residual wave data power; (h) subtracting from said digitized wave data said sine and cosine waveforms providing the minimum residual wave data power to provide a first residual waveform; (i) successively performing the steps (b) to (h) on said first to n-th residual waveforms to determine a second to n-th non-harmonic frequency components.

$$X(T) = \sum_{m=M-L+1}^{M} W(m)\sin(2\pi m/T) \quad (2)$$

$$Y(T) = \sum_{m=M-L+1}^{M} W(m)\cos(2\pi m/T)$$

The amplitude A(T) of the sine function of the given period T and the amplitude B(T) of the cosine function of the given period T are respectively $$A(T)=X(T)/(L/2)$$

$$B(T)=Y(T)/(L/2) \quad (3)$$

Thus, residual wave data R(m) is $$R(m)=W(m)-A(T)S(m)-B(T)C(m) \quad (4)$$

The residual amount Q(T) resulting from summing the square of R(m) over a defined interval from J to M is $$Q(T) = \sum_{m=J}^{M} \{R(m)\}^2 \quad (5)$$

Assuming that W(m) is a sine waveform having an amplitude V, a period (T+d) and a phase P and also that L=nT(n=1, 2, 3, ... ), the A(T) and B(T) are respectively $$A(T)=V\{\cos(P)\cos(M_1)+\sin(P)\sin(M_2)\}$$

$$B(T)=V\{\sin(P)\cos(M_3)-\cos(P)\sin(M_4)\} \quad (6)$$

where $M_j=2\times dE_j/T$, and $0<E_j<1$ (j=1, 2, 3, 4)

When d=0, i.e., the given period coincides with the period of a sine waveform of W(m), the Q(T) is the least or the minimum. Accordingly, the amplitude $A_1$ of the first sine function and the amplitude $B_1$ of the first cosine function are $$A_1=V\cos(P)$$

$$B_1=V\sin(P) \quad (7)$$

Thus, adding the first sine function and the first cosine function results equivalently in the above-mentioned sine waveform having the amplitude V and the phase P. This may be expressed as follows:

$$V\sin(2\pi m/T+P)=A_1\sin(2\pi m/T)+B_1\cos(2\pi m/T)$$

$$V=\{A^2+B^2\}^{1/2}$$

$$P=\tan^{-1}(B_1/A_1) \quad (8)$$

Although in Equation (5) the squared values are summed, it is to be noted that absolute values may be taken and summed instead. Further, as will be clear from Equation (8), removing the sine and cosine functions from the wave data is exactly the same as removing the sine waveform resulting from the synthesis.

If the W(m) is comprised of a plurality of sine waveforms having different periods, the procedure determines the period T which gives the least or the minimum of Q(T), uses the resulting A(T) and B(T) as the amplitude $A_1$ of the first sine function and the amplitude $B_1$ of the first cosine function, respectively, subtracts the sine and cosine functions having the respective amplitudes from W(m) to obtain a first residual waveform subjects the first residual waveform to the similar analysis to obtain new sine and cosine functions, and repeats itself.

To determine if sufficient analysis has been made, the convergence of the residual waveform is examined, as follows:

The residual amount is compared between the nth residual waveform resulting from subtracting the first to the nth sine waveforms from W(m) and the (n+1)th residual waveform obtained by further substraction of the (n+1)th sine waveform in order to check the convergence of the residual waveform. Let the integrals (additions) of the square of the nth and the (n+1)th residual waveforms over the defined interval from m=J to m=M to be denoted as I(n) and I(n+1), respectively. In general, I(n) decreases with n=1, 2, 3, . . .
When $$I(n)=I(n+1), \qquad (9)$$

or Equation (9) holds approximately, the n constitutes the convergence point.

If, in this manner, the amplitudes $A_1, A_2, \ldots A_k$ and $B_1, B_2, \ldots, B_k$, and the periods $T_1, T_2, \ldots T_k$ have been determined as defining the sine and cosine waveform components of W(m), the amplitude $V_n$ of a vibration having a period $T_n$ is $$V_n=(An^2+Bn^2)^{1/2} \qquad (10)$$

$$(n=1, 2, \ldots, k)$$

The frequency is given by $1/T_n$, and the phase is $$P_n=\tan^{-1}(B_n/A_n) \qquad (11)$$

FIG. 1 is a block diagram showing the procedure for analysis as mentioned above. In FIG. 1, D1 denotes a wave memory block; D2, D3, D4 and D7 computational blocks; D5 a memory block for computed values; D6 a comparison/ discrimination and computational block; and D8 a memory block for parameters. A waveform to be analyzed is supplied from an input terminal a to D1 and then to D2 where the amplitudes A(T) and B(T) of the sine and cosine functions having the period T and the sine and cosine functions with the respective amplitudes are determined. The A(T), B(T) and T are fed to D5, and the functions are sent to D3 where they are removed from the waveform to be analyzed in order to determine the residual waveform. In D4, the residual amount which corresponds to the power of the residual waveform is derived and sent to D5. With T altered, the above procedure is repeated from D2. The amplitudes and the residual amounts for all the given T's are determined and stored in D5, and then the period $T_1$ and the amplitude pair $A_1, B_1$ which give the least amount of residuals are determined and stored in D8. The resulting first sine and cosine waveforms defined by these are fed to D7 where they are removed from the waveform stored in D1 to determine the first residual waveform. The waveform having been stored in D1 is replaced by the first residual waveform which is subjected to the similar treatment to that for the above waveform to be analyzed. The period $T_2$ and the amplitude pair $A_2, B_2$ which are the parameters characterizing the second sine and cosine waveforms are stored in D8, and the second residual waveform is determined in D7. The waveform in D1 is replaced by the second residual waveform, and by repeatedly subjecting the residual waveforms for a given range of T to the similar treatment a specified number of times, e.g., N times, N sets of the parameters $(T_k, A_k, B_k)$ are determined and stored in D8. With the use of the parameters stored in D8, it is possible to synthesize the waveform to be analyzed and further to provide a predicted waveform by extrapolation of the waveform as synthesized. Also, it is possible to have an ideal bandpass filtered waveform by performing the above synthesis with the period (or frequency) limited to a certain range.

BRIEF DESCRIPTION OF DRAWINGS

FIG. 3 is the spectrum which results from the Fourier analysis of the wave data shown in FIG. 2a.

FIGS. 5a to 5e are views useful for explaining the analysis, synthesis and prediction of wave data according to the present method.

FIG. 5f shows the spectrum resulting from the FFT. waveform to be analyzed; (b) a synthesized and predicted waveform, (c) a residual waveform, (d) the spectrum of the waveform to be analyzed; (e) the spectrum resulting from the present method; and (f) the spectrum resulting from the FFT.

FIGS. 6a to 6e are views useful for explaining the analysis, synthesis and prediction of wave data with random noise according to the present method.

FIG. 6f shows the spectrum resulting from the FFT.

DETAILED DESCRIPTION OF THE INVENTION

Figure 1:
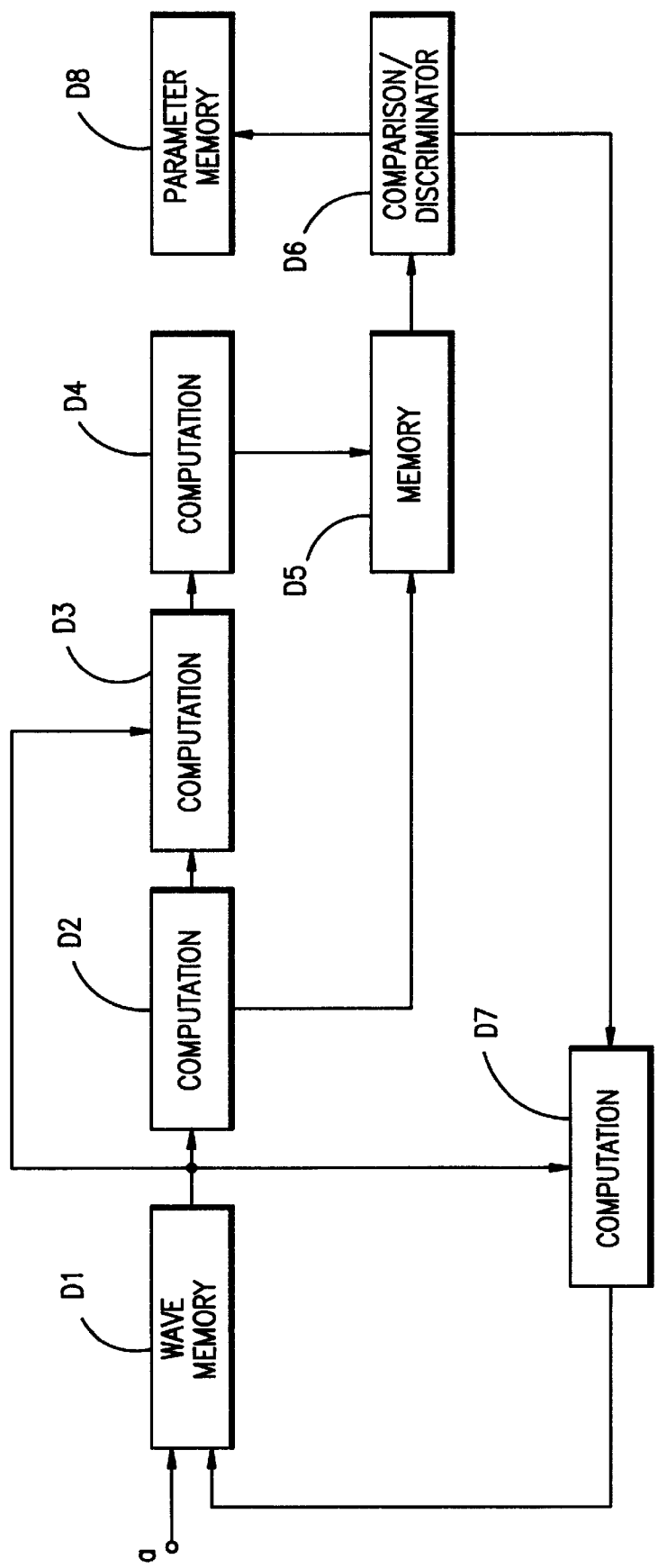
FIG. 1 is a block diagram showing the procedure for non-harmonic analysis and synthesis of wave data, in which a is an input terminal; D1 a wave memory block; D2, D3, D4 and D7 computational blocks; D5 a memory for computed values; D6 a comparison/discrimination and computational block; and D8 a memory for parameters.

An example of the non-harmonic analysis performed on the wave data W(m) comprised of a sequence of 500 values will be explained.

Example (1) If the predetermined interval is equal to one such given period, assuming T=500, X(500) is given by the sun of W(1)S(1), W(2)S(2), . . . , W(500)S(500). and Y(500) is given by the sum of W(1)C(1), W(2)C(2), . . . , W(500) C(500). In this case, the amplitudes are given by substituting L=500 in Equation (3). In a like manner, assuming T=499, X(499) is given by the sun of products W(m)S(m) for m=2 to 500, and Y(499) is given by the sum of products W(m) C(m) for m=2 to 500, and the amplitudes are given by substituting L=499 in Equation (3), and so on. It should be noted that S(m) and C(m) for each T are given by substituting the value T in Equation (1).

Where it is desired to determine the period at which the Q(T) is the minimum, although one may select the period at which the Q(T) value is smaller than those on both sides of the period, the following method can also be used.

Assuming that the given period T is from 500 to 1, if this period is divided into a first period band (T=500 to 400), a second period band (T=401 to 300), a third period band (T=301 to 200), a fourth period band (T=201 to 100), and a fifth period band (T=101 to 1), one may determine the period giving the least of Q(T) in each band and omit the periods in the ends of each band. The predetermined interval is from m=1 to 500, for example.

Example (2) If the predetermined interval is equal to two such given periods, assuming T=250, X(250) is given by the sum of W(1)S(1), W(2)S(2), . . . , W(500)S(500), and Y(250) is given by the sum of W(1)C(1), W(2)C(2), . . . , W(500) C(500). The amplitudes are given by substituting L=500 in Equation (3). In a like manner, as T=249, X(249) is given by the sum of products W(m)S(m) for m=3 to 500, and Y(249) is given by the sum of products W(m)C(m) for m=3 to 500, and the amplitudes are given by substituting L=498 in Equation (3), and so on. It should be noted that S(m) and C(m) for each T are given by substituting the value T in Equation (1).

Where it is desired to determine the period at which the Q(T) is the , the method as described in connection with Example (1) can be used.

Example (3) If the predetermined interval is equal to three such given periods, assuming T=166, X(166) is given by the sum of W(3)S(3), . . . , W(500)S(500), and Y(166) is given by the sum of W(3)C(3), . . . , W(500)C(500). The amplitudes are given by substituting L=498 in Equation (3). In a like manner, assuming T=165, X(165) is given by the sun of products W(m)S(m) for m=6 to 500, and Y(165) is given by the sum of products W(m)C(m), and the amplitudes are given by substituting L=495 in Equation (3), and so on. It should be noted that S(m) and C(m) for each T are given by substituting the value T in Equation (1).

Where it is desired to determine the period at which the Q(T) is the minimum, the method as described in connection with Example (1) can be used.

Each time the residual waveform is derived by removing the sine waveform giving the minimum of Q(T), the state of convergence is checked by integrating (summing) the square of the residual waveform and using Equation (9) to fin the convergence point. Referring to Example 1, if the band-wise analysis is used as described above, the interval of integration (summation) is from m=1 to 500 for the first period band, from m=100 to 500 for the second period band, from m=200 to 500 for the third period band, from m=300 to 500 for the fourth period band, and from m=400 to 500 for the fifth period band. Referring to Example (2), the intervals of integration for the first, second and third period bands are similar to those for the respective bands in Example (1), and the interval of integration is from m=300 to 500 for the fourth period band and from m=400 to 500 for the fifth period band. In a like manner, referring to Example (3), the interval of integration is from m=200 to 500 for the fifth period band and those for the other period bands are similar to those in Example (1) .

Figure 2A:
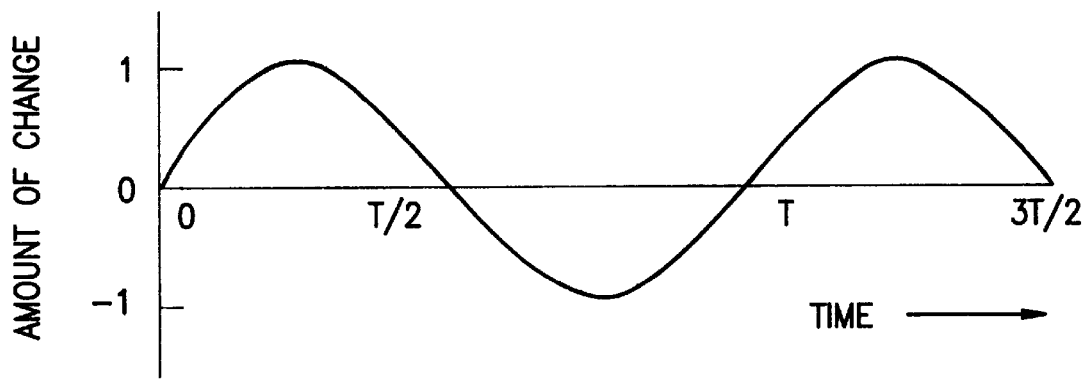
FIGS. 2a and 2b show the wave data and the spectrum obtained by the present method, respectively.
Figure 2B:
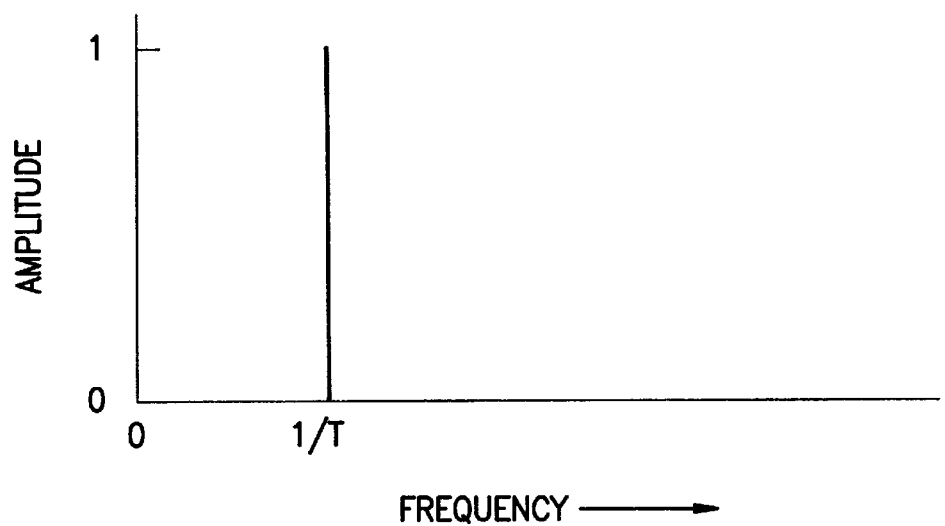

FIG. 2a illustrates wave data as a waveform (1) which is one and a half periods of a sinusoid having a period T, and FIG. 2b shows the spectrum (2) resulting from the analysis of the present method.

Figure 3:
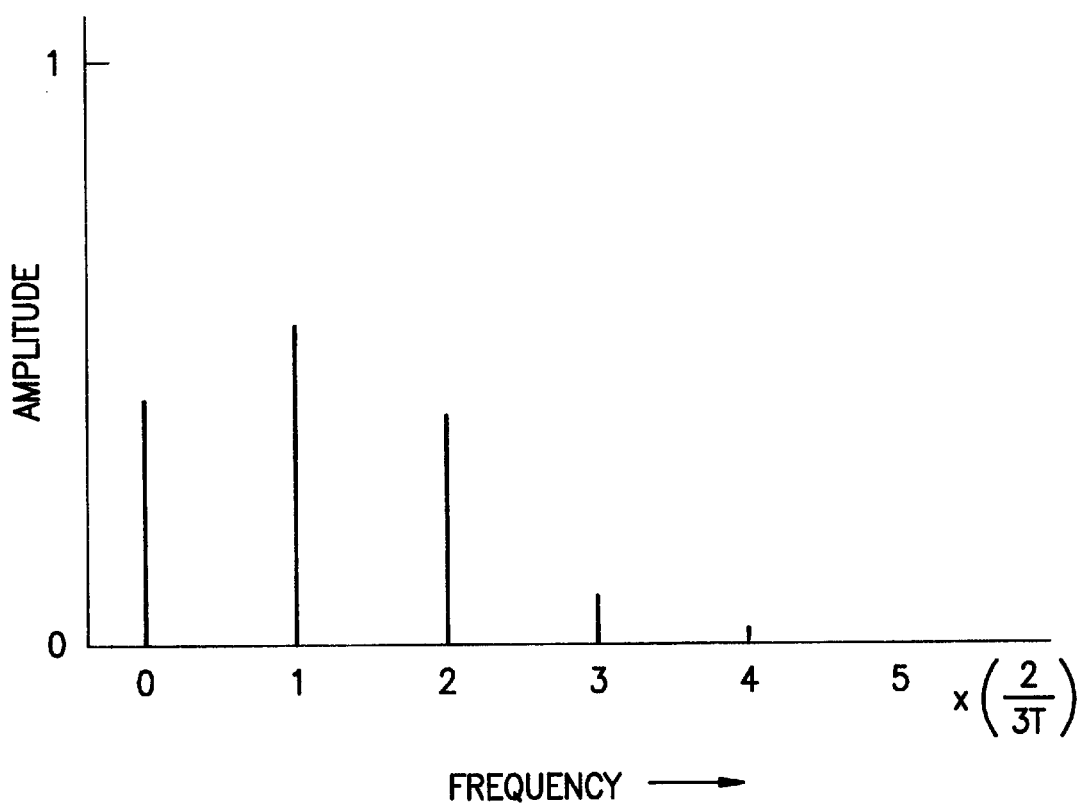

FIG. 3 illustrates the spectrum obtained by performing a harmonic analysis (the Fourier analysis) of the waveform (1) of FIG. 2.

Figure 4A:
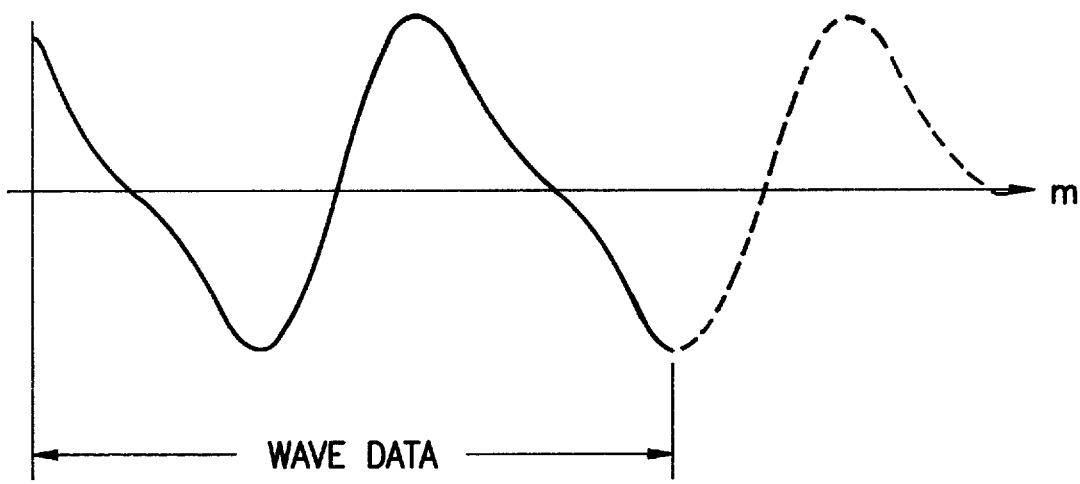
FIG. 4a shows a view showing the wave data (solid lines) and a waveform (dotted lines) predicted according to the present method
Figure 4B:
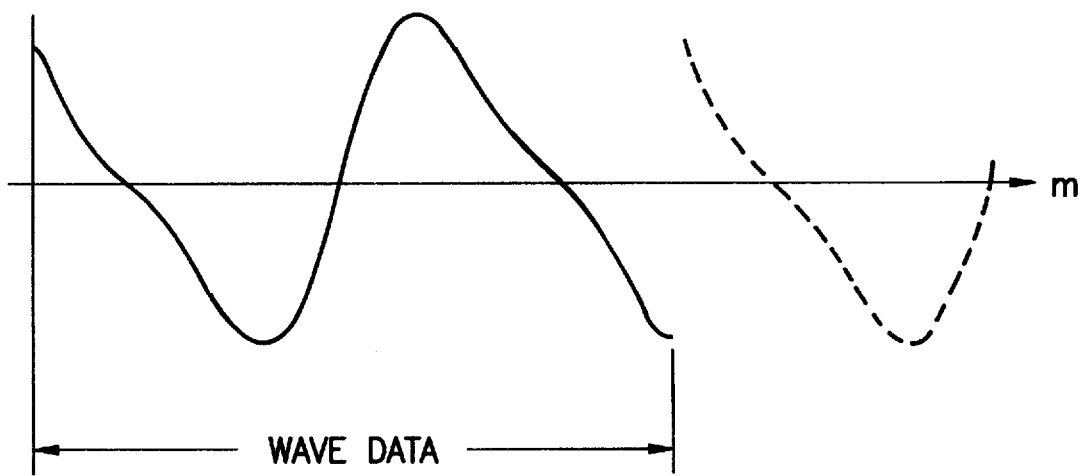
FIG. 4b shows a similar view showing the case where the Fourier analysis is employed.

FIGS. 4a to 4e illustrate the predicted waveforms (dotted lines) which result from analyzing the wave data shown in solid lines, synthesizing and extrapolating the waveform using the present method (1) and FIG. 4f shows the harmonic analysis (2) (the Fourier analysis), respectively.

The method of non-harmonic analysis and synthesis of wave data according to the present invention makes it possible to characterize sine wave components of a varying waveform which is not necessarily harmonic with one vibration and which is comprised of a summation of independent vibrational waveforms, typically an almost periodic waveform. If the length of the wave data is particularly short, the length of more than one period is sufficient to detect such components from the fragmentary waveform without causing spurious response. Accordingly, if this analysis is applied to varying physical wave data, it is possible to detect actual periodically changing components from the varying data. If it is applied to a time sequence of data occurring in the field of economy, it is possible to make the analysis with higher accuracy than the conventional method and also to obtain predicted data from the synthesized waveform. For signal transmission (storage), it is possible to achieve bandwidth compression by transmitting (storing) the parameters ($A_k$, $B_k$, $T_k$) obtained by the present method. In this case, the signal waveform is cut into a predetermined data length to undergo the analysis, and then the above parameters are obtained for each interval for successive transmission (storage). At the receiving (reproducing) side, the above parameters are used to provide each sine waveform which is summed to reconstruct the signal waveform.

The following examples show that the present method enables a separation of random noise from a signal waveform by analyzing, synthesizing and predicting it.

FIGS. 5a to 5e show an example showing prediction of waveform spectrum and prediction of waveform by synthesis using the present method. FIG. 5a is a waveform to be analyzed, and FIG. 5d is the spectrum. Also, FIG. 5e is the spectrum predicted as a result of analyzing the interval [0, 512] of the waveform to be analyzed, FIG. 5b is the waveform resulting from synthesizing sinusoids obtained from the analysis and predicting it after 512, and FIG. 5c is the difference between the waveform to be analyzed and the synthesized waveform in the interval of [0, 512]. The spectral plot shows the relative amplitude in the vertical axis versus the relative frequency 1/T in the horizontal axis. For comparison purposes, FIG. 5f shows the results of spectrum prediction by FFT.

FIGS. 6a to 6e illustrate the results of analyzing the waveform of FIG. 5 to be analyzed having random noise added thereto in the manner similar to FIGS. 5a to 5e, showing the effect of the noise and the noise suppression effect. FIG. 6a is the waveform to be analyzed having the random noise added, FIG. 6d is the spectrum of the waveform to be analyzed with no noise added. For further explanation, please refer to the description of FIGS. 5a to 5e. It is to be noted that in making the analysis of FIGS. 5a to 5e and FIGS. 6a to 6e, n=4; N=30; and T was changed from 10 to 128 one by one.

The most straightforward manifestation of the effects of the method of non-harmonic analysis and synthesis of wave data according to the present invention is found in its accuracy of detection of waveform periodicity and locality. Since the present method of analysis enables a detection of period from a fragmentary waveform of a minimum of one wavelength, it is possible to determine the amount of attenuation of individual sine waveforms, e.g., a plurality of exponentially decaying sine waveforms of different periods, of which a decaying waveform is comprised, from the varying amplitudes thereof, by determining the amplitude of each sine waveform while moving the point of analysis. By so doing, it is possible to observe complex changes of attenuating vibrations as changes in the amplitude of each frequency component. This can be applied to analysis of sounds from musical instruments and seismic waveforms.

It should be noted that in performing the method of non-harmonic analysis and synthesis of wave data according to the present invention, it is possible to divide periods (or frequencies) for analysis into bands and to proceed with the analysis from lower frequency bands in a successive manner. In this case, if the number of divided bands is s, the computational time is approximately 1/s. If the computational blocks (e.g., D2–D3 in FIG. 1) are a parallel arrangement of s sets of such blocks in which the s bands are subjected to simultaneous computation, the computational time of that part is approximately $1/s^2$. These are not intended to modify the present invention.

I claim:

1. A method for analyzing a physical waveform into non-harmonic frequency components, comprising the steps of:

(a) converting a given interval of a physical waveform into a corresponding digitized wave data;

(b) multiplying said digitized wave data by a first sine and a first cosine function having a first predetermined period, respectively, to provide a first and a second product value;

(c) summing said first and second product values over a first predetermined interval, respectively, to provide a first and a second summation value, said first predetermined interval being an integer multiple of said first predetermined period and being equal to or smaller than said given interval;

(d) determining the amplitudes of said first sine and first cosine functions based on said first and second summation values, respectively;

(e) subtracting from said digitized wave data a sine and a cosine waveform having the thus determined respective amplitudes and said first predetermined period to provide a residual wave data;

(f) successively performing the steps (b) to (e) on said digitized wave data using a second to n-th sine and cosine functions having a second to n-th predetermined periods to provide their respective (n–1) residual wave data;

(g) checking the power of said n residual wave data to determine as a first non-harmonic frequency component said sine and cosine waveforms providing a minimum residual wave data power;

(h) subtracting from said digitized wave data said sine and cosine waveforms providing the minimum residual wave data power to provide a first residual waveform; and (i) successively performing the steps (b) to (h) on said first to n-th residual waveforms to determine a second to n-th non-harmonic frequency components.

2. The method according to claim 1, wherein said step (g) of checking the power of said n residual wave data comprises summing the square of said n residual wave data over a predetermined interval.

3. The method according to claim 1, wherein said step (g) of checking the power of said n residual wave data comprises summing the absolute value of said n residual wave data over a predetermined interval.

* * * * *